(12) United States Patent
Park et al.

(10) Patent No.: US 7,385,851 B1
(45) Date of Patent: Jun. 10, 2008

(54) REPETITIVE ERASE VERIFY TECHNIQUE FOR FLASH MEMORY DEVICES

(75) Inventors: Sheung-Hee Park, Pleasanton, CA (US); Ming Kwan, San Leandro, CA (US); Wing Leung, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/615,710

(22) Filed: Dec. 22, 2006

(51) Int. Cl.
*G11C 16/06* (2006.01)

(52) U.S. Cl. .................. 365/185.22; 365/185.17; 365/185.21

(58) Field of Classification Search ............ 365/185.22
See application file for complete search history.

(56) References Cited

U.S. PATENT DOCUMENTS

| 5,646,891 | A | * | 7/1997 | Okamoto | 365/185.22 |
|---|---|---|---|---|---|
| 6,055,188 | A | * | 4/2000 | Takeuchi et al. | 365/185.22 |
| 6,157,572 | A | * | 12/2000 | Haddad et al. | 365/185.22 |
| 6,172,915 | B1 | * | 1/2001 | Tang et al. | 365/185.29 |
| 6,522,585 | B2 | * | 2/2003 | Pasternak | 365/185.21 |
| 6,529,413 | B2 | * | 3/2003 | Lee et al. | 365/185.22 |
| 6,901,010 | B1 | * | 5/2005 | Hamilton et al. | 365/185.22 |
| 2007/0047327 | A1 | * | 3/2007 | Goda et al. | 365/185.29 |
| 2007/0183220 | A1 | * | 8/2007 | Aritome | 365/185.29 |

* cited by examiner

*Primary Examiner*—Son L Mai
(74) *Attorney, Agent, or Firm*—Ingrassia Fisher & Lorenz, P.C.

(57) ABSTRACT

Erase verify operations as described herein can be utilized for a flash memory device having an array of memory cells. The erase verify operations employ repetitive erase verify testing to double-check previously verified bits that might otherwise relax or settle into an under-erased state. Following an initial erase verify procedure, an erase verify operation may perform a secondary erase verify procedure and apply additional erase pulses to bits that have become under-erased.

23 Claims, 6 Drawing Sheets

REPETITIVE ERASE VERIFY TECHNIQUE FOR FLASH MEMORY DEVICES

TECHNICAL FIELD

Embodiments of the present invention relate generally to flash memory devices. More particularly, embodiments of the present invention relate to the erase and erase verify operations for flash memory devices.

BACKGROUND

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory element, such as a flash memory unit. In this regard, one conventional flash memory technology is based upon a memory cell that utilizes a charge trapping dielectric element that is capable of storing two bits of data. In such an arrangement, one bit can be stored using a first charge storing region on one side of the charge trapping dielectric element, while a second bit can be stored using a second charge storing region on the other side of the charge trapping dielectric element.

FIG. 1 is a cross sectional view of a conventional dual bit memory cell 100. Memory cell 100 includes a silicon nitride layer 102 and a P-type semiconductor substrate 104 having a first buried junction region 106 and a second buried junction region 108. First buried junction region 106 and second buried junction region 108 are each formed from an N+ semiconductor material. Silicon nitride layer 102 is sandwiched between two layers of silicon oxide (identified by reference numbers 110 and 112).

Overlying silicon oxide layer 110 is a polysilicon gate 114. Gate 114 is doped with an N-type impurity (e.g., phosphorus). Memory cell 100 is capable of storing two data bits: a left bit represented by the dashed circle 116; and a right bit represented by the dashed circle 118. In practice, memory cell 100 is generally symmetrical and first buried junction region 106 and second buried junction region 108 are interchangeable. In this regard, first buried junction region 106 may serve as the source region with respect to the right bit 118, while second buried junction region 108 may serve as the drain region with respect to the right bit 118. Conversely, second buried junction region 108 may serve as the source region with respect to the left bit 116, while first buried junction region 106 may serve as the drain region with respect to the left bit 116.

Practical devices include a very large number of memory cells in an array architecture having wordlines that correspond to the gates of the memory cells and bitlines that correspond to the sources and drains of the memory cells. Control logic and circuitry for the array architecture governs the selection of memory cells, the application of voltage to the wordlines, and the application of voltage to the bitlines during conventional flash memory operations, such as: programming; reading; erasing; and soft programming.

Programming of memory cell 100 can be accomplished by known hot electron injection techniques (also known as channel hot electron or CHE programming). In accordance with conventional programming techniques, the right bit 118 is programmed by applying a relatively high programming voltage to gate 114 via the appropriately selected wordline, grounding the bitline corresponding to first buried junction region 106 (which serves as the source in this case), and applying a relatively high drain bias voltage to the bitline corresponding to second buried junction region 108 (which serves as the drain in this case). Conversely, the left bit 116 is programmed by applying a relatively high programming voltage to gate 114 via the appropriately selected wordline, grounding the bitline corresponding to second buried junction region 108 (which serves as the source in this case), and applying a relatively high drain bias voltage to the bitline corresponding to first buried junction region 106 (which serves as the drain in this case).

Erasing of memory cell 100 can be accomplished by applying a relatively high negative erase voltage (e.g., −5.0 volts) to gate 114 via the appropriately selected wordline, and applying relatively high source and drain bias voltages (e.g., 5.0 volts) to the corresponding bitlines. Such erasing is intended to leave both bits of memory cell 100 in an erased or unprogrammed state. Flash memory arrays typically include sectors of many individual memory cells, and the cells are often erased on a sector-by-sector basis. In other words, all of the bits in a given sector are erased before the erase operation proceeds to the next sector. An erase verify operation may be performed following an erase operation to test whether all of the bits in the sector are actually erased.

An erase verification operation is similar to the programming operations mentioned above, however, lower wordline voltages and lower bitline bias voltages are applied. The goal of an erase verification operation is to determine whether the threshold voltage ($V_T$) of the target memory cell is within a desired range corresponding to an acceptable erase state. The erase verification operation generates a very low verification current in the target memory cell and compares the verification current to a reference current generated by a reference memory cell.

BRIEF SUMMARY

A flash memory erase verify technique as described herein can be utilized in connection with sector-by-sector erase operations. The erase verify technique employs repetition as necessary to ensure that relaxation associated with erased bits does not result in under-erased bits. The flash memory erase verify technique may also include electrical stressing of the flash memory array, which accelerates the relaxation effect.

The above and other aspects of the invention may be carried out in one embodiment by an erase verify method for a flash memory array that is configured to store information corresponding to a plurality of bits. The method involves: performing an erase operation on a sector of the flash memory array; thereafter sequentially determining, beginning at a first bit in the sector, whether bits in the sector pass an erase verify test; and, if any bit in the sector fails the erase verify test, performing a secondary erase verify operation on the sector, beginning at the first bit.

The above and other aspects of the invention may be carried out in one embodiment by an erase verify method for a flash memory array that is configured to store information corresponding to a plurality of bits. The method involves: confirming that a first bit in the flash memory array is in an erased state, and thereafter determining whether a second bit in the flash memory array passes an erase verify test. If the second bit fails the erase verify test, the method applies at least one additional erase pulse to the second bit until it passes the erase verify test and thereafter commences a bit-by-bit erase verify operation, beginning at the first bit. If the second bit passes the erase verify test, the method then determines whether a third bit in the flash memory array passes the erase verify test.

The above and other aspects of the invention may be carried out in one embodiment by an erase verify method for a flash memory array that is configured to store information corresponding to a plurality of bits. The method involves: performing an erase operation on a sector of the flash memory array; thereafter performing an initial erase verify operation on the sector; thereafter electrically stressing the sector to accelerate a relaxation effect in the sector; thereafter performing a sector erase verify operation for at least one bit in the sector; and, if any bit in the sector fails during the sector erase verify operation, performing a secondary erase verify operation on the sector.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
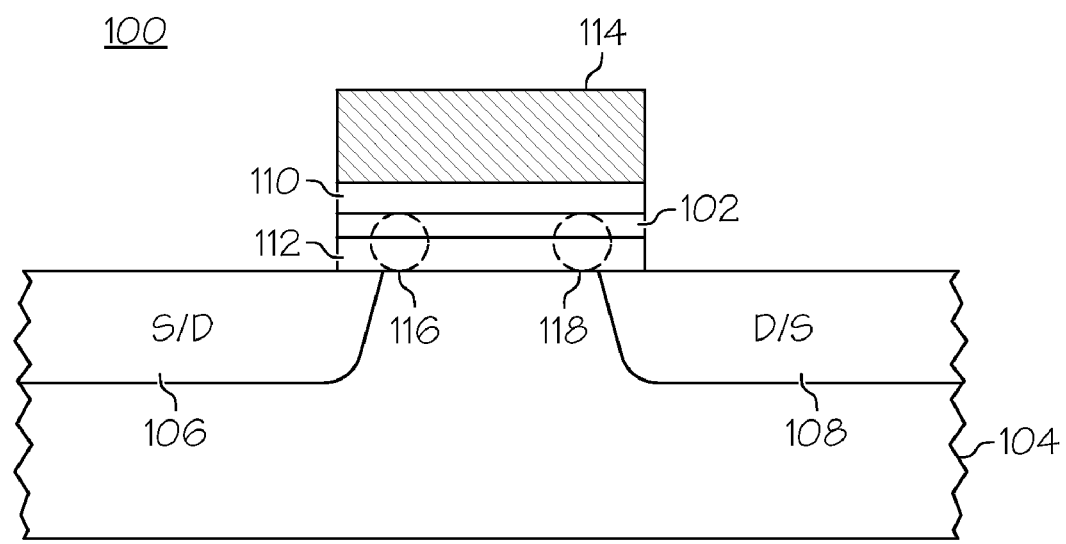
FIG. 1 is a cross sectional view of a conventional dual bit memory cell.

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

Embodiments of the invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present invention may be practiced in conjunction with any number of data transmission protocols and that the system described herein is merely one example embodiment of the invention.

For the sake of brevity, conventional techniques related to transistor design and manufacturing, the control of flash memory devices, memory cell programming, memory cell erasing, memory cell verification operations, and other functional aspects of the devices and systems (and the individual operating components of the devices and systems) may not be described in detail herein. Furthermore, the connecting lines shown in the various figures contained herein are intended to represent example functional relationships and/ or physical couplings between the various elements. It should be noted that many alternative or additional functional relationships or physical connections may be present in an embodiment of the invention.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/ node/feature, and not necessarily mechanically. Thus, although the schematic shown in FIG. 2 depicts one example arrangement of elements, additional intervening elements, devices, features, or components may be present in an embodiment of the invention (assuming that the functionality of the system is not adversely affected).

Figure 2:
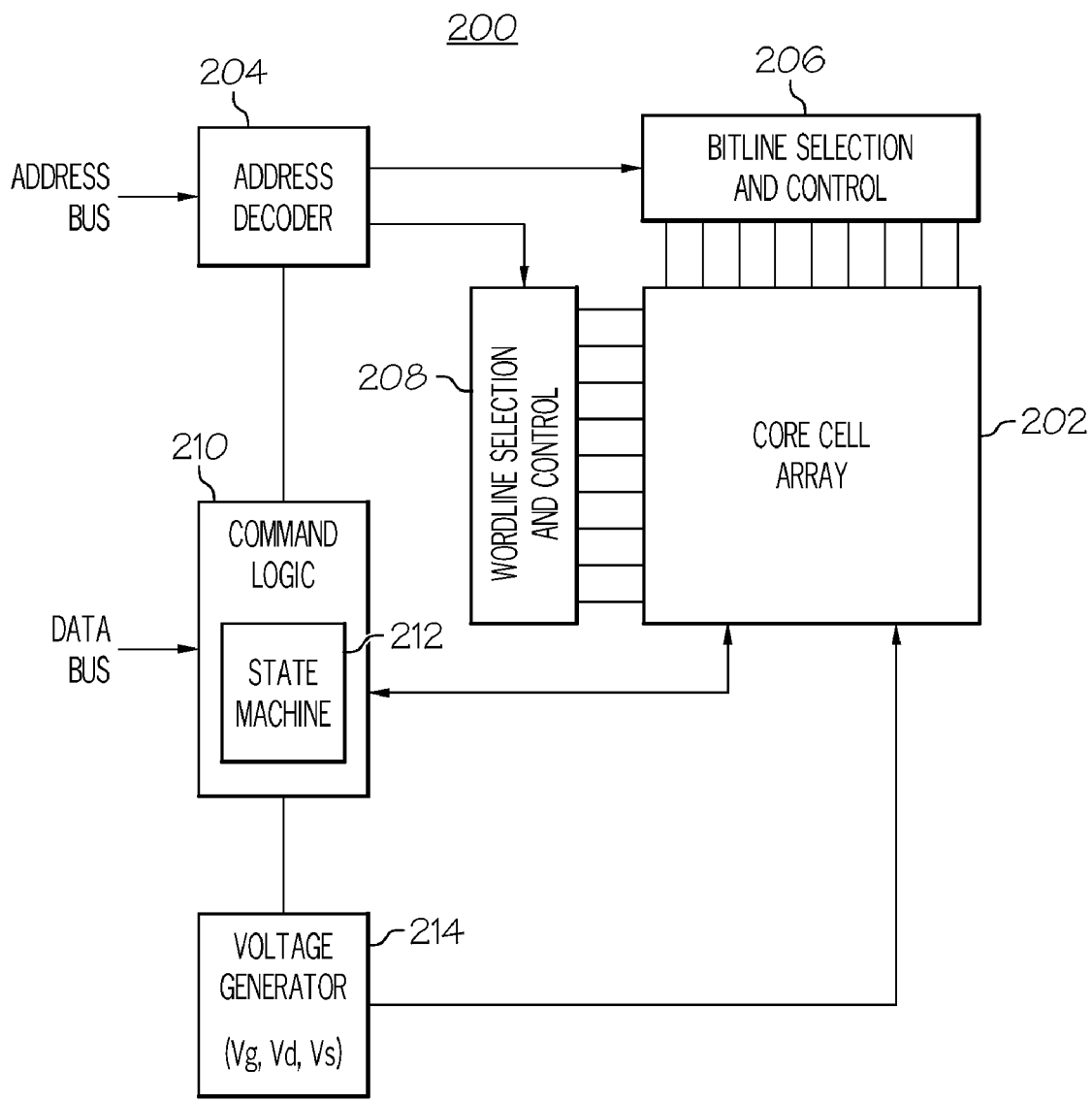
FIG. 2 is a schematic representation of a flash memory system configured in accordance with an example embodiment of the invention.

FIG. 2 is a schematic representation of a flash memory system 200 configured in accordance with an example embodiment of the invention. System 200 is an overly simplified representation of an example embodiment, and an actual deployment of system 200 may include conventional elements, logic, components, and functionality not shown in FIG. 2. Briefly, system 200 is provided for performing programming, verifying, soft programming and erasing of a core cell array 202, which may utilize a virtual ground architecture or any suitable flash memory architecture.

Core cell array 202 includes a plurality of memory cells arranged in an addressable manner. A memory cell is a transistor-based element that may be configured to store one or more bits of information, depending upon the operating characteristics and configuration of the memory cell. In a practical flash memory system, each bit of information ultimately represents either a logic high or a logic low value. As used herein, a "bit" may also refer to a single-bit memory cell itself and/or any portion of a multiple-bit memory cell that is configured to retain a charge corresponding to a single bit of information. In this regard, the memory cells within core cell array 202 may be dual bit memory cells, single bit memory cells, or any suitably configured flash memory cells. In practical embodiments, core cell array 202 is partitioned into a plurality of sectors, where memory cells within a sector are grouped together via all the wordlines that share the same sector address. It is to be appreciated that core cell array 202 could be realized in any number of different configurations, for example, 128,000 cells comprised of 16 normal bits and 16 complimentary bits on 16 cells. In addition, core cell array 202 may utilize any number of sectors (within practical limitations).

Flash memory system 200 includes an address decoder 204 coupled to core cell array 202 for decoding input and/or output ("I/O") signals during various operations that are performed on core cell array 202 (e.g., programming, reading, verifying, soft programming, erasing). In this example, address decoder 204 receives address bus information from a system controller (not shown) or the like. Address decoder 204 may be coupled to bitline selection and control logic 206, which is suitably configured to select one or more desired bitlines as needed to support the various flash memory operations described herein. Likewise, address decoder 204 may be coupled to wordline selection and control logic 208, which is suitably configured to select one or more desired wordlines as needed to support the various flash memory operations described herein. System 200 may leverage known addressing and switching techniques to select a desired target cell (or a plurality of target cells) in core cell array 202 for programming, soft programming, reading, erasing, program verification, erase verification, soft program verification, etc.

Flash memory system 200 may also utilize a command logic component 210, which may include or communicate with a state machine 212. In example embodiments of system 200, command logic component 210 and/or state machine 212 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

In this example, command logic component 210 is coupled to core cell array 202 using suitable interconnection elements, structure, or architecture. Command logic component 210 and state machine 212 may receive commands or instructions from a data bus connected to a system controller or the like. The commands or instructions invoke algorithms embedded in command logic component 210 and state machine 212. The algorithms perform the various tasks and processes related to programming, reading, erasing, soft programming, verifying, and other operations to be described herein. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Flash memory system 200 may also include a voltage generator component 214, which is coupled to core cell array 202, to command logic component 210, and to state machine 212. Voltage generator component 214 is controlled by command logic component 210 and/or state machine 212. Voltage generator component 214 is suitably configured to generate the necessary operating voltages utilized in connection with programming, reading, erasing, soft programming, and verifying of the memory cells in core cell array 202. For example, voltage generator component 214 may include or utilize one or more charge pumps, one or more voltage divider circuits, and/or one or more distinct voltage sources. Voltage generator component 214 may be designed to provide any number of fixed, variable, and/or dynamically adjustable voltage signals. As described in more detail below, voltage generator component 214 is configured to generate and apply the following to core cell array 202, without limitation: programming voltages ($V_G$) applied to the wordlines of target cells; drain voltages ($V_D$) applied to selectable bitlines of target cells; source voltages ($V_S$) applied to selectable bitlines of target cells; verification voltages applied to the wordlines of target cells; verification voltages applied to the wordline of a reference cell; and bias voltages applied to the reference cell.

Figure 3:
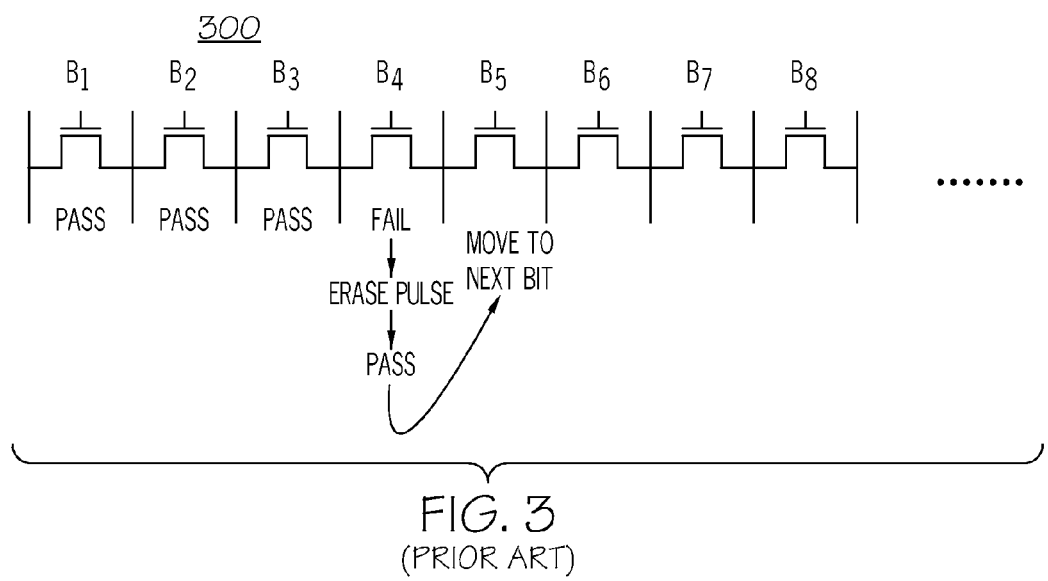
FIG. 3 is a diagram illustrating a conventional erase verify scheme for a portion of a flash memory sector.

FIG. 3 is a diagram illustrating a conventional erase verify scheme for a portion of a flash memory sector 300. For simplicity, only eight bits (corresponding to eight single-bit cells) of sector 300 are shown in FIG. 3. These bits are sequentially numbered from a first or beginning bit in the sector ($B_1$) to an eighth bit in the sector ($B_8$). This sequence may represent an addressing scheme for sector 300, an erase order for the bits in sector 300, and/or an erase verify order for the bits in sector 300. This conventional erase verify scheme is performed after the entire sector 300 has been erased. As described above, erase verify operations are performed as a double-check to ensure that all of the bits in sector 300 have been adequately erased.

The erase verify scheme depicted in FIG. 3 begins by performing an erase verify test on the beginning bit in sector 300, $B_1$. If necessary, additional erase pulses are applied to $B_1$ until it passes the erase verify test. FIG. 3 assumes that $B_1$ immediately passes the erase verify test and that no additional erase pulses are applied to $B_1$. Thereafter, the next bit in the sequence ($B_2$) is similarly treated. In other words, the erase verify test is performed on $B_2$ and, if necessary, additional erase pulses are applied to $B_2$ until it passes the erase verify test. FIG. 3 depicts a scenario where the first three bits ($B_1$, $B_2$, and $B_3$) each pass the erase verify test immediately; no additional erase pulses are applied to any of the first three bits. The fourth bit ($B_4$), however, does not immediately pass the erase verify test. Therefore, at least one additional erase pulse is applied to $B_4$ until it passes the erase verify test. After $B_4$ passes the erase verify test, the operation proceeds to the next bit, $B_5$. This process is repeated bit-by-bit throughout sector 300 until the last bit in sector 300 has passed the erase verify test. As mentioned above, relaxation of bits occurring early in the erase verify operation (e.g., $B_1$ or $B_2$) may result in under-erased bits in the sector, especially if the erase verify operation takes a long time to complete.

Figure 4:
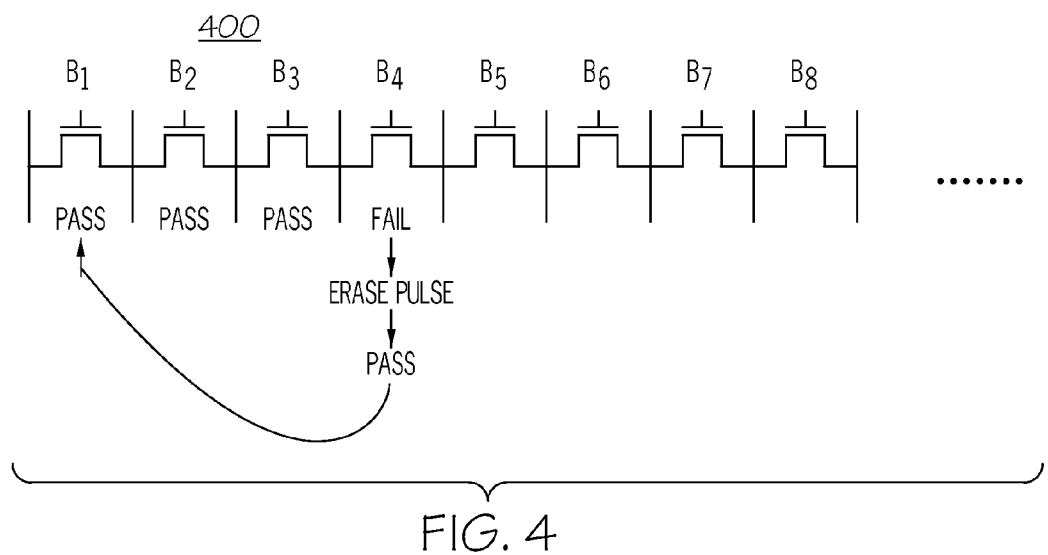
FIG. 4 is a diagram illustrating an erase verify scheme for a portion of a flash memory sector.
Figure 5:
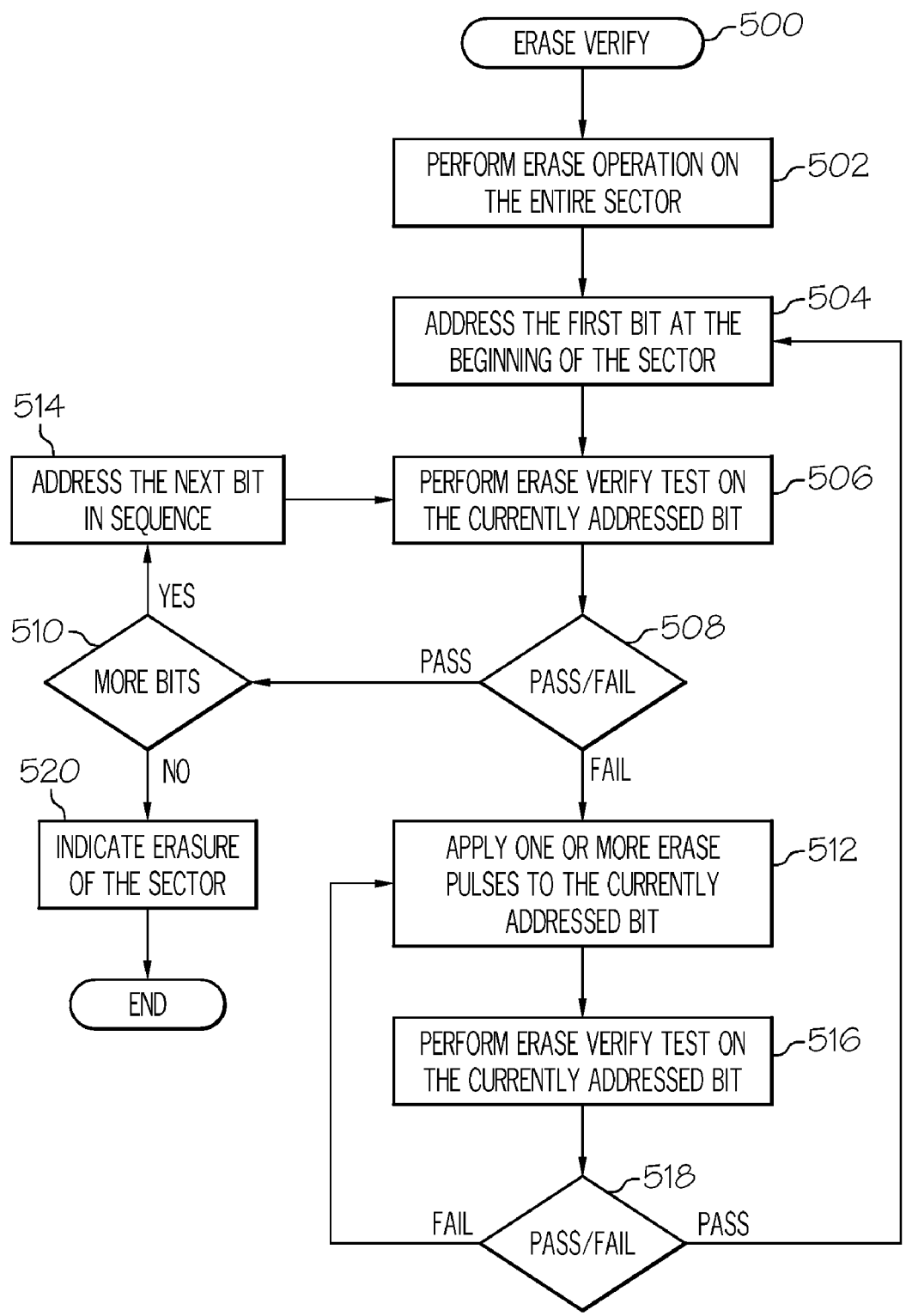
FIG. 5 is a flow chart illustrating an erase verify process corresponding to the erase verify scheme depicted in FIG. 4.

FIG. 4 is a diagram illustrating an improved erase verify scheme for a portion of a flash memory sector 400, and FIG. 5 is a flow chart illustrating an erase verify process 500 corresponding to the erase verify scheme depicted in FIG. 4. The various tasks performed in connection with process 500 may be performed by software, hardware, firmware, or any combination thereof. For illustrative purposes, the following description of process 500 may refer to elements mentioned above in connection with FIG. 2. In embodiments of the invention, portions of process 500 may be performed by different elements of the described system, e.g., address decoder 204, bitline selection and control logic 206, wordline selection and control logic 208, command logic component 210, or voltage generator component 214. It should be appreciated that process 500 may include any number of additional, alternative, or fewer, the tasks shown in FIG. 5 need not be performed in the illustrated order, and process 500 may be incorporated into a more comprehensive procedure or process having additional functionality not described in detail herein.

For simplicity, only eight bits (corresponding to eight single-bit cells) of sector 400 are shown in FIG. 4. These bits are sequentially numbered from a first or beginning bit in the sector ($B_1$) to an eighth bit in the sector ($B_8$). This sequence may represent an addressing scheme for sector 400, an erase order for the bits in sector 400, and/or an erase verify order for the bits in sector 400. Erase verify process 500 begins by performing an erase operation on a sector of a flash memory array (task 502). Any suitable sector-based erase scheme or algorithm may be employed to erase the sector during task 502. Thereafter, process 500 can initiate the erase verify procedure by addressing or otherwise selecting the first bit at the beginning of the sector (task 504). In the example depicted in FIG. 4, the first bit $B_1$ has the beginning address for sector 400.

Figure 6:
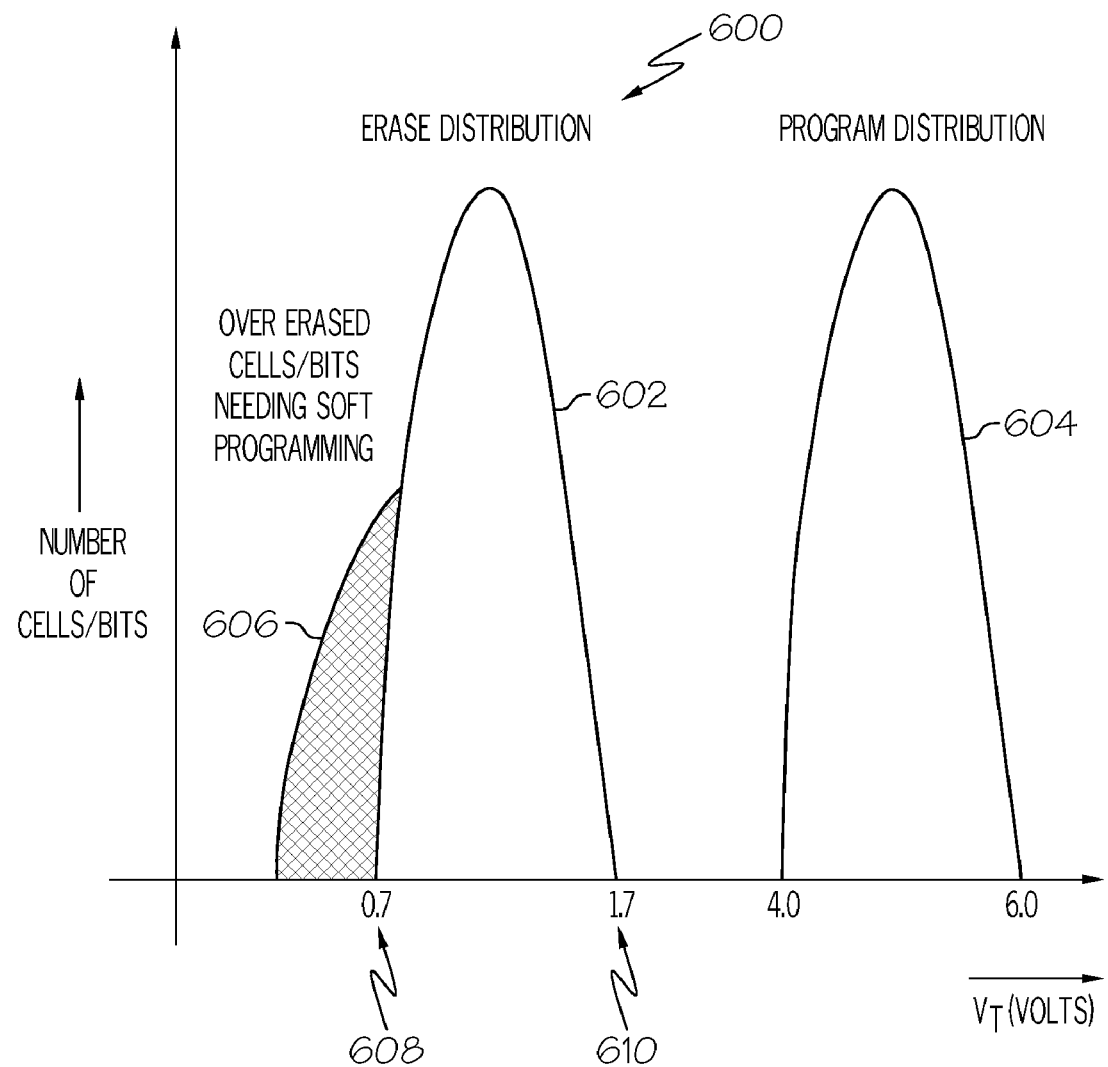
FIG. 6 is a distribution plot illustrating an erased cell threshold voltage distribution and a programmed cell threshold voltage distribution of a number of cells in an example dual bit memory cell array, together with over-erased cells that require soft programming.

Next, erase verify process 500 performs an erase verify test on the currently addressed bit (task 506), which is $B_1$ in this example. Any suitable erase verify operation can be employed by process 500. Flash memory erase verification operations are performed to check whether the $V_T$ of a target memory cell is within a desired range corresponding to an acceptable erase state. Threshold voltage of a cell, $V_T$ is defined as the gate voltage at which a cell conducts a reference current (typically, the reference current level is around 10 microamperes) at a fixed drain-to-source voltage (typically, around 1.2 volts). In this regard, FIG. 6 is a distribution plot 600 illustrating an erased cell threshold voltage distribution and a programmed cell threshold voltage distribution of a number of cells in an example memory cell array, together with over-erased cells that require soft programming. In particular, FIG. 6 illustrates characteristic cell threshold voltage distribution curves of an exemplary memory array illustrating a desired erased cell threshold voltage distribution 602, and desired programmed cell threshold voltage distribution 604.

After an erase operation, some cells may have been over-erased, producing excessively low $V_T$ values for the over-erased cells (shaded region 606), which may cause problems with subsequent read, program verify, or erase operations. Soft programming techniques are typically used to correct the over-erased cells, by applying one or more soft program pulses to the over-erased cells. Soft programming raises the low $V_T$ of these cells above the soft program verify $V_T$ reference level (identified by reference number 608) to effectively narrow the $V_T$ distribution of erased cells in the array. Soft program verification is performed by comparing the current produced in a target memory cell to that of a reference memory cell conducting reference current (typically, the reference current level is around 10 microamperes). In this example, the soft program verify $V_T$ reference level is 0.7 volt (identified by reference number 608).

After an erase operation, some cells may remain under-erased, producing excessively high $V_T$ values for the under-erased cells. The erase verify tests described here in connection with erase verify process 500 check for such under-erased bits. In the example depicted in FIG. 6, if the $V_T$ of a cell exceeds 1.7 volts (identified by reference number 610), then that cell is deemed to be under-erased, un-erased, or programmed. Erase verification is performed by comparing the current produced in a target memory cell to that of a reference memory cell conducting reference current. In this example, the erase verify $V_T$ reference level is 1.7 volts. If a cell is deemed to be under-erased, then one or more additional erase pulses will be applied to that cell in an attempt to lower its $V_T$ below the erase verify $V_T$ reference level.

Referring again to FIG. 4 and FIG. 5, a suitable erase verify test can be performed for the beginning bit ($B_1$) in sector 400. Erase verify process 500 determines whether the currently addressed bit passes or fails the erase verify test (query task 508). If the current bit passes the erase verify test, then process 500 may proceed to a query task 510. If the current bit fails the erase verify test, then process 500 may proceed to a task 512. For the example depicted in FIG. 4, the first bit $B_1$ immediately passes the erase verify test and no additional erase pulses are applied to $B_1$. Query task 510 determines whether more bits remain for erase verification. If so, then process 500 addresses or otherwise selects the next bit in the sector, in the desired sequence (task 514). Referring to FIG. 4, the next bit in the sequence is $B_2$.

Query task 508 is performed to sequentially determine whether bits in the sector pass the erase verify test. Tasks 506, 508, 510, and 514 form a loop that repeats itself in a bit-by-bit fashion as long as the bits continue to immediately pass the erase verify test. The erase verify testing performed during this loop may be considered to be an initial erase verify operation in the context of erase verify process 500. This loop ends and the initial erase verify operation is terminated whenever any bit in the sector fails the erase verify test. In response to such a failure, erase verify process 500 may initiate a secondary erase verify operation on the sector, beginning at the first bit in the sector. In the example depicted in FIG. 4, the loop of tasks 506, 508, 510, and 514 is performed three times (bits $B_1$, $B_2$, and $B_3$ immediately pass their respective erase verify tests). The $B_4$ bit, however, does not immediately pass the erase verify test, and query task 508 will detect this failure of the erase verify test.

If query task 508 detects a failure of the erase verify test, then erase verify process 500 may apply at least one additional erase pulse to the currently addressed bit (task 512) and thereafter perform the erase verify test (task 516) on the currently addressed bit. If the currently addressed bit fails the erase verify test at this time (query task 518), then tasks 512 and 516 may be repeated. In this manner, one or more additional erase pulses can be applied to the currently addressed bit until it passes the erase verify test. The example illustrated in FIG. 4 assumes that $B_4$ passes the erase verify test after application of only one additional erase pulse. Although not shown in FIG. 4, if the first bit in the sector fails the erase verify test at query task 508, then process 500 will apply one or more additional erase pulses (as needed) to confirm that the first bit is in an erased state before proceeding to the second bit in the sector.

If the currently addressed bit passes the erase verify test at query task 518, then erase verify process 500 returns to task 504 to re-address the first bit in the sector. Returning to the beginning bit in the sector represents the commencement of a secondary erase verify operation on the sector. The secondary erase verify operation is a sequential bit-by-bit operation. During this secondary erase verify operation, erase verify process 500 sequentially determines whether bits in the sector pass the erase verify test, as explained above. This secondary erase verify operation is performed to ensure that bits in the sector have not relaxed to the point of being under-erased. If any bit in the sector fails the erase verify test during the secondary erase verify operation, then the secondary erase verify operation can be repeated, beginning at the first bit in the sector. For example, the next iterations of task 506 and query task 508 determine whether B$_1$ has remained in its erased state. If not, additional erase pulses can be applied to B$_1$ to confirm its erasure.

After all of the bits in the sector pass the erase verify test and query task 510 determines that the last bit in the sector has been verified, then erase verify process 500 may perform a task 520 to indicate erasure of the sector. This may occur as a result of the initial erase verify operation only, or this may occur as a result of a secondary erase verify operation.

Figure 7:
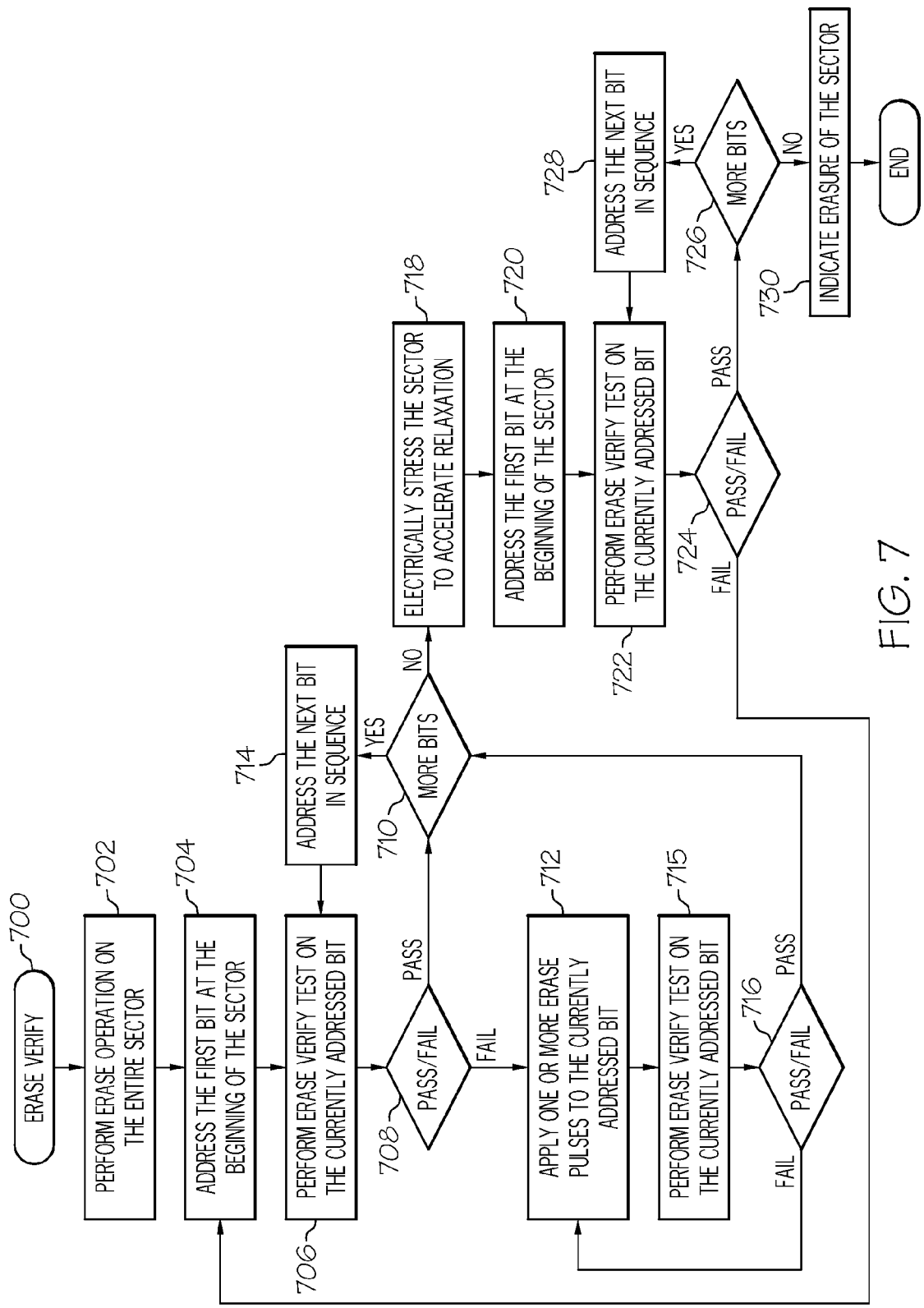
FIG. 7 is a flow chart illustrating another erase verify process for a flash memory sector.

FIG. 7 is a flow chart illustrating an erase verify process 700 according to an alternate embodiment. The various tasks performed in connection with process 700 may be performed by software, hardware, firmware, or any combination thereof. For illustrative purposes, the following description of process 700 may refer to elements mentioned above in connection with FIG. 2. In embodiments of the invention, portions of process 700 may be performed by different elements of the described system, e.g., address decoder 204, bitline selection and control logic 206, wordline selection and control logic 208, command logic component 210, or voltage generator component 214. It should be appreciated that process 700 may include any number of additional, alternative, or fewer, the tasks shown in FIG. 7 need not be performed in the illustrated order, and process 700 may be incorporated into a more comprehensive procedure or process having additional functionality not described in detail herein. Moreover, process 700 may include tasks that are identical or similar to certain tasks in erase verify process 500 (see FIG. 5), and such common tasks will not be redundantly described in detail in the context of process 700.

Erase verify process 700 begins by performing an erase operation on a sector of a flash memory array (task 702). Thereafter, process 700 performs an initial erase verify operation on the sector, followed by an electrical stress operation on the sector. Electrically stressing the sector in this manner accelerates a relaxation effect for bits in the sector, where such relaxation would normally occur over a much longer period of time. After applying the electrical stress, process 700 performs a sector erase verify operation for at least one bit in the sector and, if any bit in the sector fails during the sector erase verify operation, process 700 performs a secondary erase verify operation on the sector.

Tasks 702, 704, 706, 708, 710, and 714 are similar to tasks 502, 504, 506, 508, 510, and 514, respectively (see FIG. 5 and related description). This loop represents a bit-by-bit erase verify scheme that repeats itself as long as the bits continue to immediately pass the erase verify test. Once query task 708 detects a failed bit, erase verify process 700 may apply one or more erase pulses to the currently addressed bit (task 712) and thereafter perform the erase verify test (task 715) on the currently addressed bit. If the currently addressed bit fails the erase verify test at this time (query task 716), then tasks 712, 715, and 716 may be repeated until the currently addressed bit passes the erase verify test.

If the currently addressed bit passes the erase verify test at query task 716, then erase verify process 700 returns to query task 710 to check whether more bits remain. If so, then process 700 continues to task 714 to address and thereafter process the next bit in the sequence. Thus, process 700 performs the initial erase verify operation in a bit-by-bit manner to sequentially confirm that each bit in the sector is in an erased state. If query task 710 determines that no bits remain, then process 700 may electrically stress the sector to accelerate the relaxation effect (task 718). In one embodiment, this electrical stressing is accomplished by applying a gate stress bias voltage to cells or bits in the sector, while placing the corresponding drain and source nodes in a floating or open state. Depending upon the implementation, the gate stress bias voltage may have a range between 3.0 volts and 10.0 volts. In practice, the gate stress bias voltage is applied to the entire sector for a given period of time, for example, between 100 nanoseconds and 10 seconds. In another embodiment, the electrical stressing is accomplished by applying a drain stress bias voltage to cells or bits in the sector, while placing the corresponding gate and source nodes in a floating or open state. Depending upon the implementation, the drain stress bias voltage may have a range between 3.0 volts and 7.0 volts. In practice, the drain stress bias voltage is applied to the entire sector for a given period of time, for example, between 1.0 nanosecond and 10 seconds. It may also be possible to stress both the gate and the drain with the source floating during the stressing.

As mentioned above, the relaxation effect in a flash memory bit may cause the bit to become under-erased, even though the bit was previously verified to be fully erased. This settling of the bit occurs naturally and can result in relaxation between about 0.2 volts to about 1.0 volt. The actual amount of voltage shift will depend upon the device material and erase bias conditions. The long term natural relaxation effect can be somewhat slow (for example, up to 24 hours at room temperature). The electrical stressing of the sector can accelerate the relaxation effect such that it occurs within milliseconds rather than hours.

After electrically stressing the sector, erase verify process 700 then performs a sector erase verify operation, beginning at the first bit in the sector. In this regard, process 700 addresses the first bit of the sector (task 720), performs the erase verify test on the currently addressed bit (task 722), and tests whether the currently addressed bit passes or fails the erase verify test (query task 724). Tasks 722, 724, 726, and 728 are similar to tasks 506, 508, 510, and 514, respectively (see FIG. 5 and related description). This loop represents a bit-by-bit erase verify scheme that repeats itself as long as the bits continue to pass the erase verify test. In this embodiment, however, once query task 724 detects a bit that has failed the erase verify test, process 700 returns to task 704 to initiate a secondary erase verify operation on the sector. In other words, the sector erase verify operation need not (and preferably does not) apply additional erase pulses to failed bits. Rather, process 700 can apply additional erase pulses as needed during task 712. Thus, the sector erase verify operation sequentially verifies bits in the sector without applying additional erase pulses. This saves time and expedites process 700.

In practice, the electrical stressing in task 718 and the sector erase verify operation can be repeated until all of the bits in the sector pass the sector erase test of task 722. After all of the bits in the sector pass the sector erase verify operation and query task 726 determines that the last bit in the sector has been verified, then erase verify process 700 may perform a task 730 to indicate erasure of the sector. This may occur as a result of the initial erase verify operation only, or this may occur as a result of a secondary erase verify operation.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. An erase verify method for a flash memory array that is configured to store information corresponding to a plurality of bits, the method comprising:
performing an erase operation on a sector of the flash memory array;
thereafter sequentially determining, beginning at a first bit in the sector, whether bits in the sector pass an erase verify test; and
if any bit in the sector fails the erase verify test, performing a secondary erase verify operation on the sector, beginning at the first bit.

2. A method according to claim 1, further comprising indicating erasure of the sector if all bits in the sector pass the erase verify test.

3. A method according to claim 1, further comprising:
detecting when a bit in the sector fails the erase verify test; and
applying at least one additional erase pulse to the bit until it passes the erase verify test.

4. A method according to claim 1, wherein:
sequentially determining whether bits in the sector pass the erase verify test is performed during an initial erase verify operation; and
the method further comprises terminating the initial erase verify operation when a bit fails the erase verify test during the initial erase verify operation.

5. A method according to claim 1, wherein the first bit in the sector corresponds to a bit having a beginning address for the sector.

6. A method according to claim 1, wherein the secondary erase verify operation comprises sequentially determining, beginning at the first bit in the sector, whether bits in the sector pass the erase verify test.

7. A method according to claim 6, further comprising:
if any bit in the sector fails the erase verify test during the secondary erase verify operation, repeating the secondary erase verify operation on the sector, beginning at the first bit.

8. A method according to claim 6, further comprising indicating erasure of the sector if all bits in the sector pass the erase verify test during the secondary erase verify operation.

9. An erase verify method for a flash memory array that is configured to store information corresponding to a plurality of bits, the method comprising:
confirming that a first bit in the flash memory array ($B_1$) is in an erased state;
thereafter determining whether a second bit in the flash memory array ($B_2$) passes an erase verify test;
if $B_2$ fails the erase verify test:
applying at least one additional erase pulse to $B_2$ until $B_2$ passes the erase verify test; and
thereafter commencing a bit-by-bit erase verify operation, beginning at $B_1$; and
if $B_2$ passes the erase verify test, thereafter determining whether a third bit in the flash memory array ($B_3$) passes the erase verify test.

10. A method according to claim 9, wherein confirming that $B_1$ has been erased comprises:
determining whether $B_1$ passes the erase verify test; and
if $B_1$ fails the erase verify test, applying at least one additional erase pulse to $B_1$ until $B_1$ passes the erase verify test.

11. A method according to claim 9, wherein the bit-by-bit erase verify operation comprises performing the erase verify test to determine whether $B_1$ remains in its erased state.

12. A method according to claim 11, further comprising:
if $B_1$ is no longer in its erased state, applying at least one additional erase pulse to $B_1$ until $B_1$ passes the erase verify test; and
if $B_1$ remains in its erased state, performing the erase verify test to determine whether $B_2$ remains in its erased state.

13. A method according to claim 9, further comprising:
if $B_3$ fails the erase verify test:
applying at least one additional erase pulse to $B_3$ until $B_3$ passes the erase verify test; and
thereafter commencing the bit-by-bit erase verify operation, beginning at $B_1$; and
if $B_3$ passes the erase verify test, thereafter determining whether a fourth bit in the flash memory array ($B_4$) passes the erase verify test.

14. A method according to claim 9, wherein $B_1$ corresponds to a bit having a beginning address for a sector.

15. A flash memory device comprising:
a flash memory array configured to store information corresponding to a plurality of bits, the flash memory array being partitioned into a plurality of sectors; and
a processing logic architecture coupled to the flash memory array, the processing logic architecture being configured to control:
an erase operation on a sector of the flash memory array;
a subsequent initial erase verify operation on the sector;
a subsequent electrical stressing of the sector to accelerate a relaxation effect in the sector;
a subsequent sector erase verify operation for at least one bit in the sector; and
if any bit in the sector fails during the sector erase verify operation, a secondary erase verify operation on the sector.

16. A flash memory device according to claim 15, wherein the processing logic architecture is configured to control the subsequent electrical stressing by controlling application of a gate stress bias voltage to cells in the sector.

17. A flash memory device according to claim 15, wherein the processing logic architecture is configured to control the subsequent electrical stressing by controlling application of a drain stress bias voltage to cells in the sector.

18. A flash memory device according to claim 15, wherein the processing logic architecture is configured to control the subsequent initial erase verify operation by sequentially confirming that each bit in the sector is in an erased state.

19. A flash memory device according to claim 15, wherein the processing logic architecture is configured to control the sector erase verify operation for at least one bit in the sector by sequentially determining whether bits in the sector pass an erase verify test.

20. A flash memory device according to claim 15, wherein the processing logic architecture is configured to control the sector erase verify operation by sequentially verifying bits in the sector without applying additional erase pulses.

21. A flash memory system comprising:
a flash memory array configured to store information corresponding to a plurality of bits, the flash memory array having addressable bitlines and wordlines, and the flash memory array being partitioned into a plurality of sectors;
selection and control logic coupled to the flash memory array and configured to select one or more bitlines and one or more wordlines during operation of the flash memory system;
a voltage generator component coupled to the flash memory array and configured to generate and apply operating voltages for the flash memory array; and
a processing logic architecture coupled to the selection and control logic and to the voltage generator component, the processing logic architecture being configured to:
control an erase operation on a sector of the flash memory array;
thereafter sequentially determine, beginning at a first bit in the sector, whether bits in the sector pass an erase verify test; and
if any bit in the sector fails the erase verify test, control a secondary erase verify operation on the sector, beginning at the first bit.

22. A system according to claim 21, wherein the processing logic architecture configured to:
detect when a bit in the sector fails the erase verify test; and
apply at least one additional erase pulse to the bit until it passes the erase verify test.

23. A system according to claim 21, wherein the secondary erase verify operation comprises sequentially determining, beginning at the first bit in the sector, whether bits in the sector pass the erase verify test.

* * * * *